United States Patent [19]

Hamakawa et al.

[11] Patent Number: 4,496,788
[45] Date of Patent: Jan. 29, 1985

[54] PHOTOVOLTAIC DEVICE

[75] Inventors: Yoshihiro Hamakawa; Hiroaki Okamoto, both of Kawanishi; Kouji Okuda, Takatsuki, all of Japan

[73] Assignee: Osaka Transformer Co., Ltd., Osaka, Japan

[21] Appl. No.: 528,988

[22] Filed: Sep. 2, 1983

[30] Foreign Application Priority Data

Dec. 29, 1982 [JP] Japan ................................ 57-234197
Mar. 24, 1983 [JP] Japan ................................ 58-49318

[51] Int. Cl.³ ............................................ H01L 31/06
[52] U.S. Cl. .................................. 136/249; 136/256; 136/258; 357/30
[58] Field of Search ................. 136/249 TJ, 258 AM, 136/258 PC, 256; 357/30

[56] References Cited

U.S. PATENT DOCUMENTS

| | | | |
|---|---|---|---|
| 4,016,586 | 4/1977 | Anderson et al. | 357/2 |
| 4,253,882 | 3/1981 | Dalal | 136/249 |
| 4,270,018 | 5/1981 | Gibbons | 136/258 AM |
| 4,271,328 | 6/1981 | Hamakawa et al. | 136/249 TJ |
| 4,292,461 | 9/1981 | Hovel | 136/249 TJ |
| 4,377,723 | 3/1983 | Dalal | 136/249 |

FOREIGN PATENT DOCUMENTS 57-49278  3/1982  Japan .......................... 136/258 AM

OTHER PUBLICATIONS

W. Fuhs et al., "Heterojunctions of Amorphous Silicon & Silicon Single Crystals", Int. Conf., Tetrahedrally Bonded Amorphous Semiconductors, Yorktown Hts., NY, (1974), pp. 345–350.

Primary Examiner—Aaron Weisstuch
Attorney, Agent, or Firm—Jackson, Jones & Price

[57] ABSTRACT

A photovoltaic device comprising at least one crystalline and one amorphous semiconductor region with different photosensitivity is provided to absorb light in a wide range of wavelength, and serves, for example, as a solar battery or a color sensor. Amorphous or microcrystalline semiconductor regions comprising those devices can be deposited easily and in a continuous manufacturing process by the use of a low temperature process, and this allows manufacture of a photovoltaic device at low cost.

35 Claims, 17 Drawing Figures

PHOTOVOLTAIC DEVICE

FIELD OF THE INVENTION

The present invention relates to a photovoltaic device applicable as a solar battery, a photodetector or the like. More particularly, it relates to a photovoltaic device known as a tandem junction solar battery wherein solar energy is absorbed in several regions having different energy gaps.

BACKGROUND OF THE INVENTION

A solar cell is a photovoltaic device comprising p-type and n-type materials and having a p-n junction at the interface between them for the conversion of solar energy directly to electrical energy. A solar battery usually consists of a plurality of solar cells connected in series and parallel to each other in a matrix fashion where a large power output is required. Hitherto, commercial solar batteries comprising a p-n, homo-, or hetero-junction of monocrystalline or polycrystalline Si, GaAs, CdS, CdTe or the like are available as well as those comprising a p-type, an i-type and an n-type layer of amorphous silicon each deposited in series and forming a p-i-n junction. Moreover, it has been suggested that a solar battery comprising a plurality of solar cells, each of which has a p-type, an i-type and an n-type amorphous silicon layer each deposited in series, may produce a high output voltage.

In the disclosure herein described, the following terms are to be construed as having the following meanings. The term "heterojunction" (HJ) is a junction formed between semiconductor regions made of different materials. The term "junction" is a homojunction made of the same materials and is often used as including a heterojunction. The "p-n junction" is a region of transition between p-type and n-type semiconductor regions. The term "p-i-n junction" is a region of successive transition between a p-type and an i-type semiconductor region and between the i-type and an n-type semiconductor region. In the field of solar cells, it is only used for solar cells made from amorphous material and plays the same role as the p-n junction in a solar cell made of crystalline material for the photogeneration of carriers. The term "amorphous p-n junction" is a region of transition formed between p-type and n-type amorphous semiconductor regions, and provides an ohmic contact between the two regions. The term "unitary cell" is sometimes used to name a solar cell which constitutes a tandem junction solar battery. A crystalline solar cell is a solar cell wherein a p-n junction is formed from crystalline regions. An amorphous solar cell is a solar cell wherein a p-i-n junction is formed from amorphous materials. A heterojunction (HJ) solar cell is a solar cell comprising a crystalline region and an amorphous region and having a p-n heterojunction between them. The adjective "amorphous" is often used as including a microcrystalline structure because a microcrystalline semiconductor may be substituted for an amorphous semiconductor in many cases.

Solar batteries must be economical for them to be widely utilized in practice. It has generally been considered that a thin-film process may lower the manufacturing cost of a solar battery. In this respect, a manufacturing process using amorphous silicon is considered desirable because it may reduce the thickness of an amorphous semiconductor region down to the order of 0.5 micrometer in contrast to about 300 micrometers in thickness of a monocrystalline silicon region which is generally employed in a crystalline or HJ solar cell. It has been expected that a thin-film process may produce a large-area device having a large light-receiving area.

Figure 1:
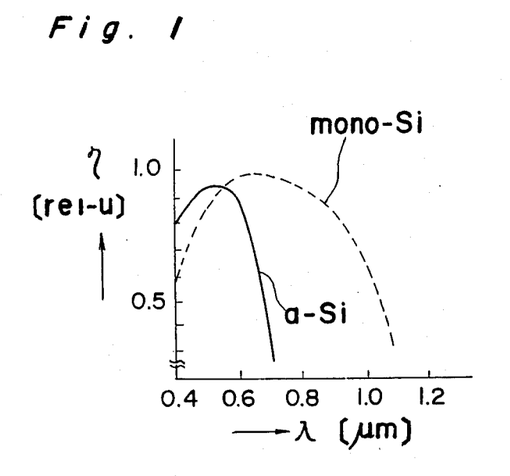
FIG. 1 is a graph showing the collection efficiency $\eta$ of both a monocrystalline silicon (mono-Si) solar cell and an amorphous silicon (a-Si) solar cell plotted against the photon wavelength $\lambda$.

The efficiency to convert solar energy into electric energy is closely related to the manufacturing cost of a photovoltaic device. An amorphous silicon solar battery has a disadvantage of having lower conversion efficiency than that of a monocrystalline silicon solar battery, though the amorphous silicon solar battery is expected to have a lower manufacturing cost when a thin film process is used to make it. FIG. 1 shows a graph of the collection efficiency $\eta$ in relative units of an amorphous silicon (a-Si) solar cell and that of a monocrystalline (mono-Si) solar cell plotted against the photon wavelength $\lambda$ in micrometers. The conversion efficiency is related to the area that the collection efficiency curve subtends. As shown in FIG. 1, the mono-Si curve extends to a relatively long wavelength, whereas the a-Si curve is limited to a shorter wavelength. Therefore, the conversion efficiency of commercial amorphous silicon solar batteries is 7-8%, which is lower than that of a monocrystalline silicon solar battery because the former may not utilize solar energy as effectively as the latter does.

In order to improve the conversion efficiency of a solar battery, a multi-layered solar battery has been studied which usually comprises semiconductor regions having different energy gaps. The region with the largest energy gap is positioned for it to absorb the incident light first, and the other regions are positioned further in series with the incident light in order of decreasing energy gap in order that the lower energy photons may penetrate deeper. Each region has its own peak value of collection efficiency at a predetermined range of wavelength in the spectrum of solar light. This type of a device, called a tandem junction solar battery, may raise the conversion efficiency because it utilizes the incident light more effectively than a solar cell made of one material does.

As for the manufacturing process, it is desirable to adopt a low temperature process. In crystalline solar cells, a p-n junction is generally prepared by using junction formation methods including a high temperature process such as a thermal diffusion process or an annealing process after an ion implantation. The former is a process wherein impurities are diffused thermally into a crystalline semiconductor which is kept at a prescribed temperature as high as about 1000° C. in an environment containing dopant impurities. The latter is a process wherein ionized dopant impurities are accelerated under a high electric field so as to be implanted into a crystalline semiconductor. In the ion implantation process, it is necessary to anneal the implanted semiconductor at a temperature as high as about 1000° C. because the crystal structure is largely disordered when once the ions have been implanted. However, a high temperature process requires a complex set-up and careful control in operation, and this increases the manufacturing cost of a solar battery. In addition, it lowers the conversion efficiency of the solar battery because undesirable impurities migrate into the crystalline semiconductor from surroundings.

With respect to an amorphous solar cell, the width of the energy gap which affects the collection efficiency may be adjusted by selecting the kind and/or the mixing ratio of the gases supplied during the manufacturing process thereof. Hydrogenated amorphous silicon carbide, SiC:H, and/or hydrogenated amorphous silicon nitride, SiN:H, have been used for shorter wavelengths, while hydrogenated amorphous silicon germanide Si-Ge:H and/or hydrogenated amorphous silicon stannide SiSn:H have been used for longer wavelengths. However, though a hydrogenated amorphous semiconductor (e.g., a-SiGe:H or a-SiSn:H) having a narrow energy gap can absorb light of longer wavelength, a multi-layered amorphous solar battery comprising various regions thereof cannot satisfactorily convert the light of longer wavelength to photocurrent because of inferior photovoltaic properties of an amorphous solar cell. On the contrary, crystalline semiconductors (e.g., Si, GaAs, or Ge) having a narrow energy gap can utilize satisfactorily the light of longer wavelength.

The reflection of the light incident on the surface of a solar cell is also important for its performance. An anti-reflecting transparent layer having a suitable refractive index and thickness has been applied on the surface of the outermost semiconductor region so as to effectively minimize the reflection.

In tandem junction solar batteries, it is necessary for the interface between unitary cells to provide a contact which does not bring about an electrical and optical loss in performance. A heavily-doped tunnel junction or a transparent conductive layer has been inserted to provide an ohmic contact. For example, in U.S. Pat. No. 4,292,461, an indium-tin-oxide transparent conductive layer is placed between a p-type crystalline silicon region and an n-type amorphous silicon region.

It should be noted, however, that the addition of such an extra material as indium-tin-oxide is liable to deteriorate an amorphous solar cell because of undesirable impurities such as indium atoms or oxygen atoms migrating into the amorphous region during the deposition. Since the unit cell having the lowest performance among the several unit cells comprising a tandem junction solar battery restricts the performance of the tandem junction solar battery, each of the units cells must have the good performance so as to obtain high conversion efficiency. Therefore, the addition of such an extra layer as indium-tin-oxide is undesirable because it brings about the deterioration of an amorphous solar cell resulting in the lowering of the performance of a tandem junction solar battery. It should also be noted that the addition of such an extra material as a transparent conductive layer may increase the manufacturing cost since it is usually deposited by using such an expensive process as an electron beam deposition process or a sputtering process and since the adoption of such an extra process interrupts the continuity of the manufacturing process.

SUMMARY OF THE INVENTION

It is an object of the present invention to provide a high-efficiency photovoltaic device by using a tandem junction structure comprising at least one crystalline semiconductor region and one amorphous semiconductor region, wherein the two regions are applied on each other without interposing any extra structure in the photogenerating regions.

It is another object of the present invention to provide a high-efficiency photovoltaic device by using a tandem junction structure by applying a plurality of unit cells, in order to improve the conversion efficiency and without interposing any extra structure in the photogenerating regions, though an amorphous semiconductor region may be interposed if necessary as will be described below.

It is a further object of the present invention to provide an economical manufacturing process of a photovoltaic device by using a low temperature process, such as a glow discharge decomposition process, to deposit amorphous or microcrystalline material. A microcrystalline semiconductor material can be used as an alternative to an amorphous material.

In accordance with the present invention, a p-n heterojunction solar cell which converts solar energy to electric energy may be formed by applying in series an amorphous semiconductor region having a wider energy gap on a crystalline semiconductor region having a narrower energy gap. The two regions are placed in the order of decreasing energy gap from the light-receiving side. If a solar cell comprises two different crystalline materials which form a p-n HJ, successive absorption of solar energy might raise the conversion efficiency remarkably. However, the lattice mismatch at the interface between the two crystalline regions results in large interface recombination of photogenerated electrons and holes, and the interface recombination severely reduces the photovoltaic performance. On the contrary, the lattice mismatch is meaningless at the interface between amorphous and crystalline regions. Even a crystalline semiconductor having different lattice constants from those of the mating amorphous or microcrystalline semiconductor can be applied for an HJ solar cell.

A tandem junction solar battery according to the present invention is formed by applying a plurality of unitary solar cells in series, wherein amorphous cells and the crystalline semiconductor regions in crystalline cells and amorphous HJ cells in the tandem junction solar battery are placed in the order of decreasing energy gap from the light-receiving side.

In accordance with the present invention, an ohmic contact is provided at the interfaces between the unit solar cells connected in series in a tandem junction solar cell without interposing any extra structure, although a semiconductor region may be interposed if necessary as will be described below. In other words, an amorphous p-n junction may be formed between p-type and n-type amorphous regions by applying two unit solar cells in series, and it provides an ohmic contact to the two unit solar cells. Amorphous semiconductors have a unique characteristic that a high density of localized states exists in the forbidden band. Photogenerated electrons and holes are exchanged through those states at the amorphous p-n junction. Therefore, the amorphous p-n junction serves to provide an ohmic contact between the unitary solar cells connected in series by utilizing this characteristic of an amorphous semiconductor. If such an amorphous p-n junction is not formed at the interface between the unit cells, for example, between a crystalline and an amorphous solar cell, an amorphous semiconductor region will be intervened between the both so as to form an amorphous p-n junction providing an ohmic contact.

DESCRIPTION OF THE PREFERRED EMBODIMENTS

Figure 2:
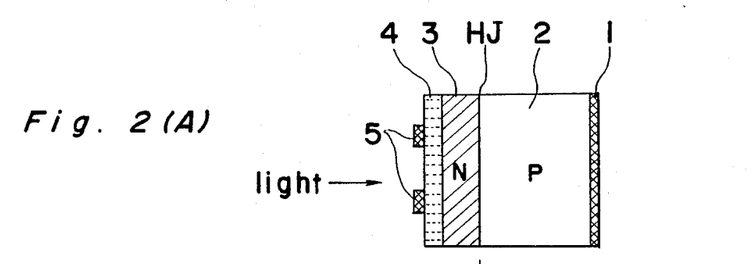
FIG. 2(A) is a schematic sectional view of a solar cell according to a first embodiment of the present invention.
FIG. 2(B) is an energy band diagram of a solar cell shown in FIG. 2(A)

Referring now to the drawings, wherein like reference characters designate like parts throughout the several views thereof, FIG. 2 (A) shows a schematic sectional view of an HJ solar cell according to a first embodiment of the present invention which uses a p-type polycrystalline silicon wafer as a crystalline semiconducting material. An aluminum electrode 1 is evaporated onto the p-type wafer 2. An n-type thin film 3 of microcrystalline silicon is deposited on the opposite side of the p-type wafer 2 to the electrode 1 by the use of a glow discharge decomposition (GD) process. A transparent conductive film 4 of indium-tin-oxide (ITO) which acts as both the front electrode and an antireflectance layer is further applied on the n-type semiconductor region 3, and a comb-like aluminum electrode 5 is still further applied on the transparent layer 4, through which solar energy is transmitted into both semiconductor regions in operation. The electrodes 1 and 5 are used to supply electric power to an external circuit. In this embodiment, an HJ solar cell comprises a p-type polycrystalline silicon wafer and an n-type microcrystalline silicon film which form a heterojunction (HJ).

FIG. 2(B) shows the energy band diagram of the HJ solar cell, wherein $E_c$, $E_v$, and $E_F$ represent the energy level at the bottom of the conduction band, the energy level at the top of the valence band and the Fermi level, respectively. The energy gap $E_{ga}$, that is, the width of the forbidden band, of the n-type microcrystalline silicon, which is about 1.8 eV, is greater than the energy gap $E_{gc}$ of the p-type polycrystalline silicon which is about 1.1 eV. Since the microcrystalline semiconductor 3 at the light-receiving side has a larger energy gap, photons with longer wavelength can not be absorbed in the microcrystalline semiconductor region 3 and are absorbed in the crystalline semiconductor region 2, which is the active region to generate mainly photocarriers. Consequently, this enhances the conversion of the solar energy into electric energy.

Figure 3:
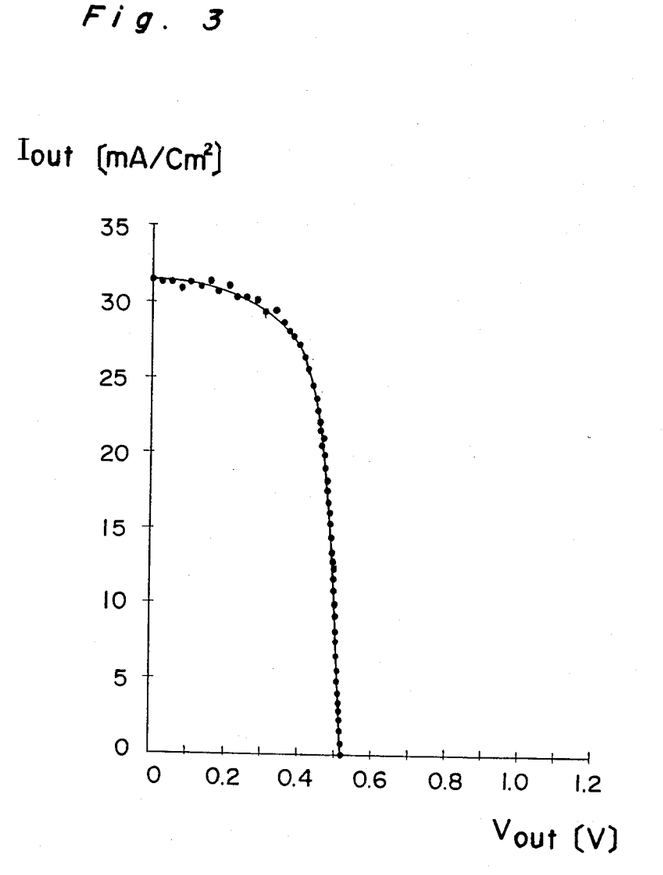
FIG. 3 is a graph showing the I-V characteristics of a solar cell shown in FIG. 2(A)

Experimental data on the I-V characteristics of the solar cell is shown in FIG. 3, where $I_{out}$ and $V_{out}$ represent the output current, in terms of mA/cm², and the output voltage of the solar cell, respectively. The conversion efficiency estimated from the I-V characteristics shown in FIG. 3 is about 11%. This value is generally of the same level as that of a solar cell which is manufactured from a polycrystalline silicon wafer by using a high temperature process such as a thermal diffusion process.

In the GD process, materials which contain constituent atoms of the film to be obtained and which are transformed into the plasma state, are decomposed into chemically active ions and/or radicals to form films at low temperatures. By the use of the GD process, n-type microcrystalline silicon can be deposited at a temperature between 200° C. and 300° C., much lower than that used in the prior art high temperature process needed to form a p-n junction made of crystalline silicon, for several minutes. Furthermore, this process is suitable to prepare devices having a large light-receiving area. Thus, an HJ solar cell according to the present invention, having the same level of performance as that of a solar cell manufactured by using a high temperature process, can be manufactured by using the low temperature process at low cost and in a continuous manufacturing process.

Alternatively, other low temperature processes than the GD process may be used to deposit the amorphous semiconductor 3 on the substrate 2. For example, a vacuum evaporation method, an ion plating process, a sputtering method, or a photochemical vapor deposition process may be employed.

It should be noted that materials such as crystalline GaAs and Ge can be substituted for the polycrystalline silicon 2, while others such as microcrystalline or amorphous, hydrogenated, or fluoridated SiC, SiN and SiGe can be substituted for the microcrystalline Si 3, so long as $E_{ga}$ is larger than $E_{gc}$. The types of conduction in the semiconductor regions may be reversed, so that a p-type amorphous or microcrystalline one 3 is applied on an n-type crystalline semiconductor region 2.

Figure 4:
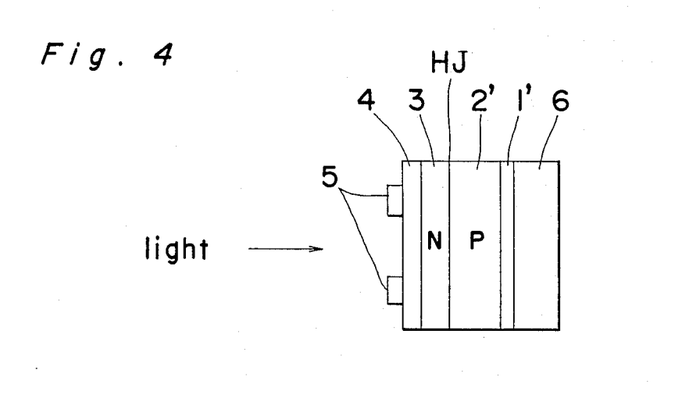
FIG. 4 is a schematic sectional view of a photovoltaic device according to a second embodiment of the present invention.

FIG. 4 shows a schematic sectional view of an HJ solar cell according to a second embodiment of the present invention wherein a crystalline semiconductor region 2' is a thin film. Substrate 6 is a thin plate of inorganic solid such as metal, glass or ceramics, or a film of organic solid such as a polyimide. An electrode 1' applied on the substrate 6 forms an ohmic contact with the p-type crystalline thin film 2', which is further deposited thereon by using a process such as a chemical vapor deposition (CVD) process, a metal-organic CVD (MOCVD) process, a molecular beam epitaxy (MBE) process, a sputtering process, or an ion plating process. The n-type microcrystalline or amorphous silicon thin film 3 is deposited onto the crystalline semiconductor 2' by using the GD process. The transparent conductive film 4 and the comb-like electrode 5 are applied on the thin film 3 in succession in a similar method as in the first embodiment of the present invention. If the substrate 6 consists of a metallic material, it serves also as an ohmic electrode and it may not be necessary to use the separate electrode 1'.

In the HJ solar cell according to a second embodiment of the present invention, the crystalline semiconductor 2' as well as the region 3 are prepared by using a thin film process so that the manufacturing cost of the solar cell can be lowered further than that of the first embodiment of the present invention. Especially, if the crystalline film 2' is made of expensive materials such as GaAs and Ge, which can absorb sunlight in the form of thin films less than several micrometers thick, the present invention may be more effective to provide a solar cell of high performance at a lower cost. If such a process as the CVD or MOCVD process which is suitable for forming a large-area film is adopted to deposit the crystalline semiconductor 2', a device having a large light-receiving area may be manufactured.

Figure 5:
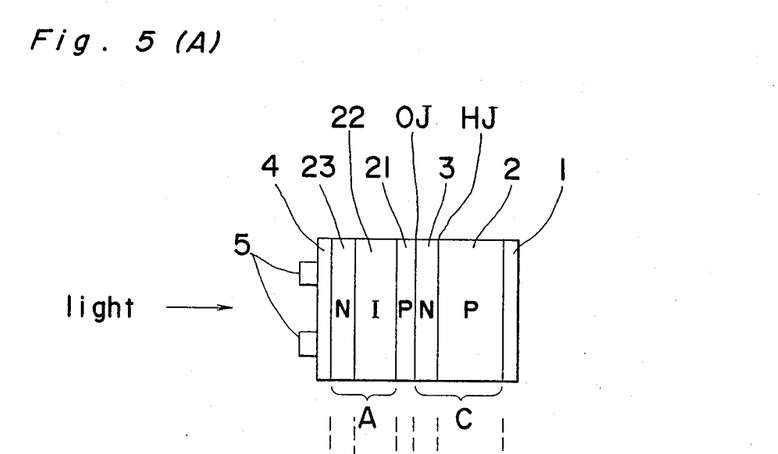
FIG. 5(A) is a schematic sectional view of a photovoltaic device according to a third embodiment of the present invention.
FIG. 5(B) is a schematic energy band diagram of a photovoltaic device shown in FIG. 5(A)

FIG. 5(A) shows a photovoltaic device according to a third embodiment of the present invention wherein an HJ solar cell C and an amorphous solar cell A are connected in series. The first solar cell C comprises a p-type wafer 2 of polycrystalline silicon and an n-type region 3 of amorphous or microcrystalline silicon which form an HJ, while the second cell A comprises a p-type region 21, an i-type region 22, and an n-type region 23 of amorphous or microcrystalline silicon which form a p-i-n junction. An aluminum electrode 1 is deposited on the p-type semiconductor 2, while a transparent conductive film 4 of ITO and comb-like electrode 5 are applied in succession on the n-type semiconductor 23. The thicknesses of the amorphous regions and ITO layer 3, 21, 22, 23 and 4 are about 3000, 500, 5000, 100 and 700 Å, respectively. It should be noted that the crystalline wafer 2 may be substituted for a crystalline film 2; a substrate as used in the second embodiment is needed in case of such a substitution. It should also be noted that the type of conduction in the semiconductor regions may be reversed.

FIG. 5(B) shows a schematic energy band diagram of the photovoltaic device shown in FIG. 5(A). The energy gap $E_{gc}$ of the p-type polycrystalline silicon 2, about 1.1 eV, is smaller than that $E_{ga}$ of the i-type amorphous layer 22 which mainly generates photocarriers in the second cell A, about 1.7–1.8 eV.

In order to connect the unitary solar cells in series effectively in a tandem junction structure, it is desirable to provide an ohmic contact at the interfaces between the unitary solar cells. The third embodiment of the present invention is characterized in that an ohmic contact is realized easily at an amorphous p-n junction by the use of the unique characteristic of an amorphous semiconductor that many localized states exist in the forbidden band, although that characteristic is disadvantageous in most cases. The absorption of light creates electron-hole pairs as shown in FIG. 5(B). Holes h in the amorphous solar cell A and electrons e in the H-J solar cell C created by the absorption of solar energy recombine through localized states $E_s$ in the forbidden band at the interface between the two unitary cells; that is, a recombination current flows across the interface, so that an ohmic contact is provided between the two solar cells. The amorphous p-n junction serves as an ohmic junction (OJ).

Figure 6:
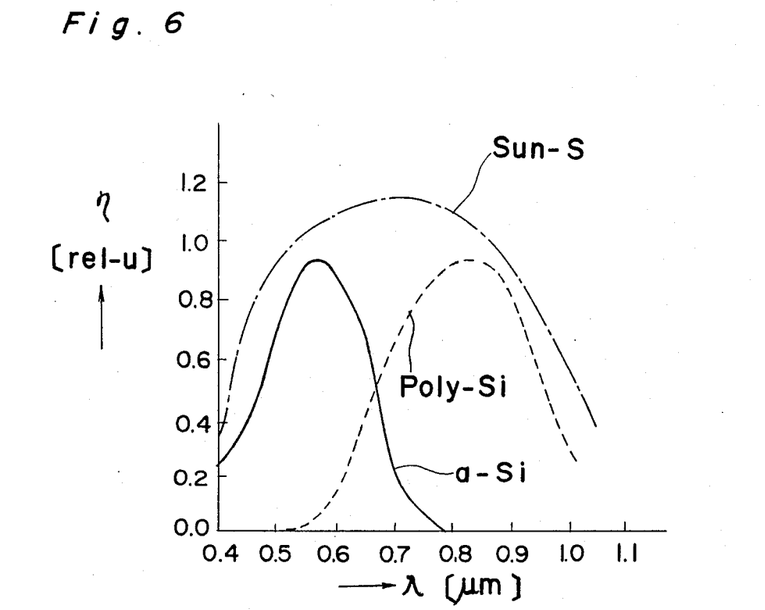
FIG. 6 is a graph showing the collection efficiency $\eta$ of an amorphous silicon solar cell (a-Si) and of the HJ solar cell (poly-Si) shown in FIG. 2(A), covered with a filter of an amorphous silicon having a thickness of 6000 Å, plotted against the wavelength $\lambda$ of the incident light.
Figure 7:
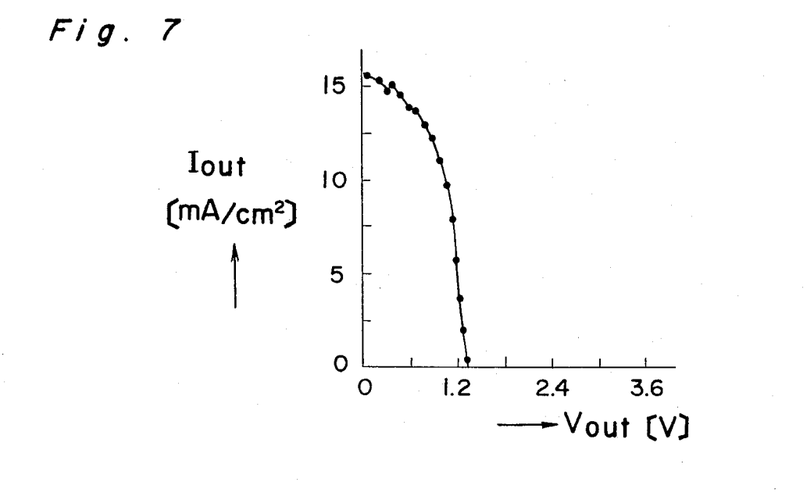
FIG. 7 is a graph of the I-V characteristics of a photovoltaic device shown in FIG. 5(A)

FIG. 6 is a graph showing the separate collection efficiencies n of the amorphous silicon solar cell A (a-Si) of FIG. 5(A) and of the H-J solar cell (poly-Si) shown in FIG. 2(A), covered with a filter of amorphous silicon having a thickness of 6000 Å, plotted against the wavelength λ of the incident light. The efficiency of the latter poly-Si cell can be considered to be almost equal to the collection efficiency of the HJ solar cell C composing the tandem junction solar cell shown in FIG. 5(A). The relative amplitude of the solar energy spectrum is shown for reference as the chain line Sun-S. Since the photovoltaic device shown in FIG. 5(A) comprises two types of materials with different light-sensitivity, as shown in FIG. 6, it may effectively absorb solar energy in a wide range of wavelengths and increases the conversion efficiency of the device. FIG. 7 shows the I-V characteristics of the photovoltaic device shown in FIG. 5(A). The conversion efficiency obtained from the data is 11–12%, which is higher than that exhibited by the prior art amorphous solar cells, i.e., 7 to 8% in general.

The efficiency value of 11–12% has been obtained in an early stage of our study. By optimizing amorphous silicon layers, a conversion efficiency of more than 15% will probably be attained in this type of cell. Moreover, although a polycrystalline silicon wafer is used as a crystalline material in this embodiment, a thin film of other materials such as GaAs, Ge and Si can be substituted for the polycrystalline silicon wafer so that the manufacturing cost of a solar cell may be reduced further.

Figure 8A:
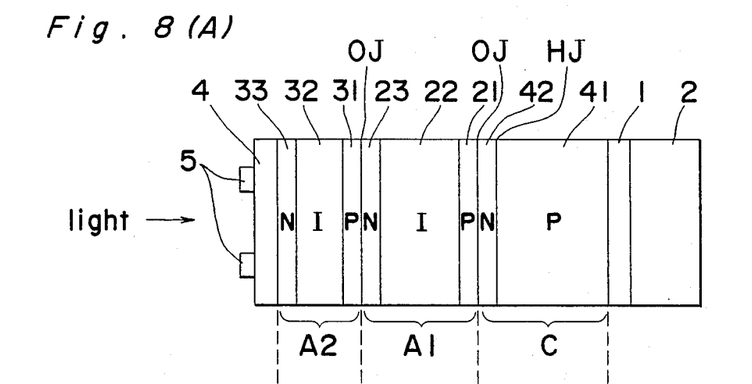
FIG. 8(A) is a schematic sectional view of a photovoltaic device according to a forth embodiment of the present invention.

FIG. 8(A) is a schematic sectional view of a photovoltaic device according to a fourth embodiment of the present invention. Two amorphous solar cells A1 and A2 are formed by depositing amorphous materials successively by means of the GD process on an HJ solar cell C described with reference to FIG. 2(A), to result in a tandem junction solar battery. The three unit cells are connected in series. Substrate 2 is made of a thin plate of inorganic material such as metal, glass or ceramics, or of a film of organic solid such as a polyimide. An ohmic electrode 1 is deposited on the substrate 2, and a p-type crystalline 41 and an n-type amorphous region 42 are deposited further in succession to form an HJ cell C. A p-type region 21, an i-type region 22 and an n-type region 23 of amorphous silicon are deposited on the n-type region 42 to form a second cell A1. A p-type region 31, an i-type region 32 and an n-type region 33 of amorphous silicon carbide are deposited on the n-type amorphous silicon 22 in succession to form a third cell A2. The junctions between the cells comprising p-type and n-type amorphous material provide ohmic contacts. Finally, a transparent conductive film 4 of ITO and a comb-like electrode 5 are deposited in succession on the semiconductor 33. It should be noted that a crystalline wafer may be substituted for a crystalline thin film 41 in the cell C; the substrate 2 is needless in case of such a substitution. It should also be noted that the type of conduction in the semiconductor regions may be reversed.

Figure 8B:
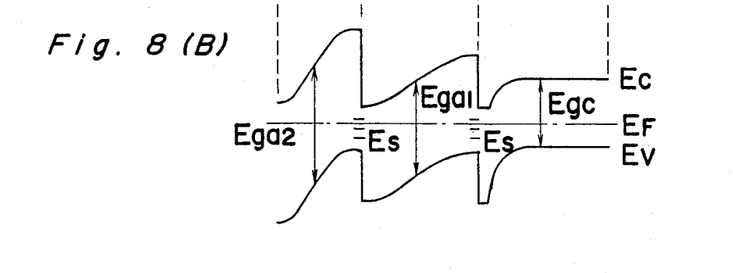
FIG. 8(B) is a schematic energy band diagram of a solar battery shown in FIG. 8(A)

FIG. 8(B) shows a schematic energy band diagram of the photovoltaic device shown in FIG. 8(A), wherein the energy gap $E_{gc}$ of the crystalline GaAs in the cell C is about 1.4 eV, the energy gap $E_{ga1}$ of the i-type amorphous silicon 22 in the first amorphous cell A1, larger than $E_{gc}$, is about 1.8 eV, and the energy gap $E_{ga2}$ of the i-type amorphous silicon carbide 32, larger than $E_{ga1}$, is about 2.0 eV. The incident light first enters the cell A2 with the largest energy gap $E_{ga2}$, and light of shorter wavelength is absorbed therein; the light transmitted through the cell A2 is absorbed in the next cell A1 with the energy gap $E_{ga1}$; finally, the light of longest wavelengths transmitted through the cells A1 and A2 is absorbed in the cell C with the smallest energy gap $E_{gc}$. Thus, in the device shown in FIG. 8(A), solar energy of shorter wavelengths may be absorbed in the amorphous solar cells A1 and A2 with p-i-n junctions, and that of longer wavelengths may be absorbed by the HJ solar cell C with a p-n HJ. Then, a solar battery of high conversion efficiency can be realized.

Figure 9:
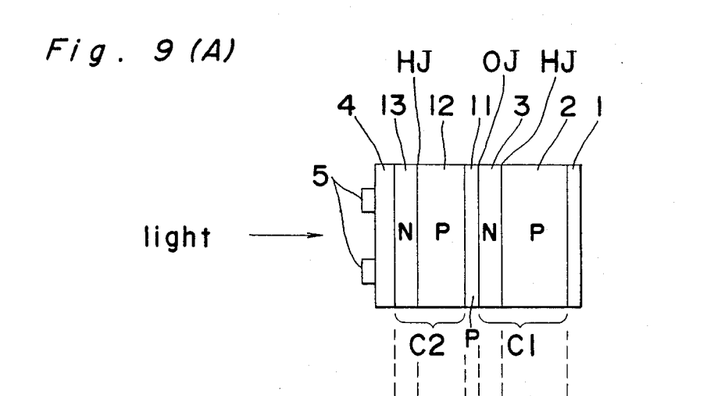
FIG. 9(A) is a schematic sectional view of a photovoltaic device according to a fifth embodiment of the present invention.
FIG. 9(B) is an energy band diagram of a solar battery shown in FIG. 9(A) across the p-n junction.

FIG. 9(A) shows a schematic sectional view of a photovoltaic device according to a fifth embodiment of the present invention. A tandem junction solar battery is constructed from two HJ solar cells C1 and C2 connected together in series with the intervention of an amorphous semiconductor region 11 whose conductivity type is the same as that of crystalline semiconductor region 12 to provide an ohmic contact between them. Solar cell C1, similar to that in FIG. 2(A), comprises a p-type crystalline semiconductor wafer 2 with an energy gap $E_{gc1}$ and an n-type microcrystalline or amorphous layer 3 with an energy gap $E_{ga1}$ larger than $E_{gc1}$; both layers 2 and 3 form a p-n HJ. It should be noted that the wafer 2 may be substituted for by a crystalline semiconductor thin film. The p-type amorphous layer 11 is deposited on the amorphous layer 3. Then, p-type crystalline semiconductor 12 having an energy gap $E_{gc2}$ larger than $E_{gc1}$ and an n-type amorphous crystalline semiconductor 13 having an energy gap $E_{ga2}$ larger than $E_{gc2}$ are deposited on the semiconductor 11 in succession. The second solar cell C2 comprises the semiconductor regions 12 and 13 which form a p-n HJ. By applying a p-type amorphous semiconductor layer 11 between the cells C1 and C2, an ohmic junction is formed at the interface between the p-type semi-conductor 11 and the n-type amorphous semiconductor 3. In the fifth embodiment, solar energy of shorter wavelengths is absorbed in the solar cell C2 with a larger energy gap adjoining the transparent electrode 4, and then solar energy with longer wavelengths may be absorbed in the solar cell C1 with a narrower gap. Then, a high conversion efficiency solar battery may be realized at a low manufacturing cost.

Figure 10:
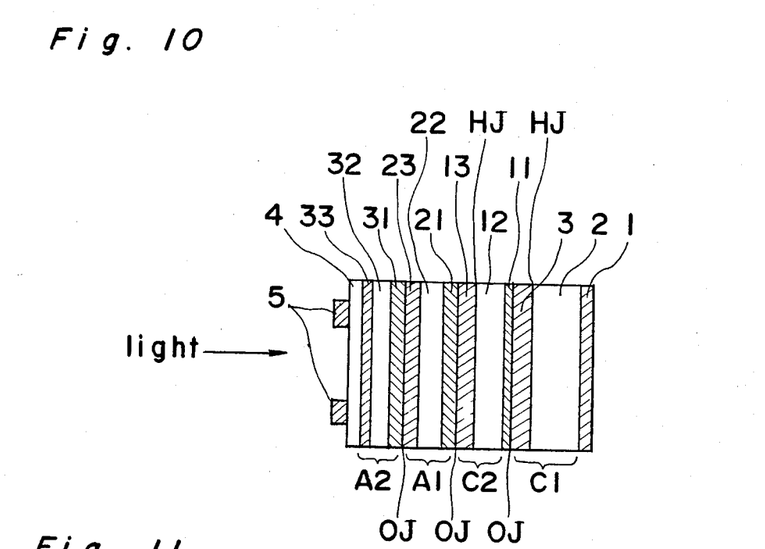
FIG. 10 is a schematic sectional view of a photovoltaic device according to a sixth embodiment of the present invention.

FIG. 10 shows a schematic sectional view of a photovoltaic device of the sixth embodiment according to the present invention. It is constructed by connecting two HJ solar cells C1 and C2 and two amorphous solar cells A1 and A2 in series. In FIG. 10, numerals 1 to 5 and 11 to 13 represent like parts shown in FIG. 9(A), and numerals 21 to 23 and 31 to 33 represent like parts shown in FIG. 8(A). Solar energy is absorbed successively first in amorphous solar cell A2 with an energy gap $E_{ga2}$, then in another amorphous cell A1 with an energy gap $E_{ga1}$ narrower than $E_{ga2}$, in an HJ solar cell C2 with an energy gap $E_{gc2}$ narrower than $E_{ga1}$, and finally in the HJ solar cell C1 with an energy gap $E_{gc1}$ narrower than $E_{gc2}$. Therefore, a solar battery with a high conversion efficiency can be manufactured at a low cost.

Figure 11:
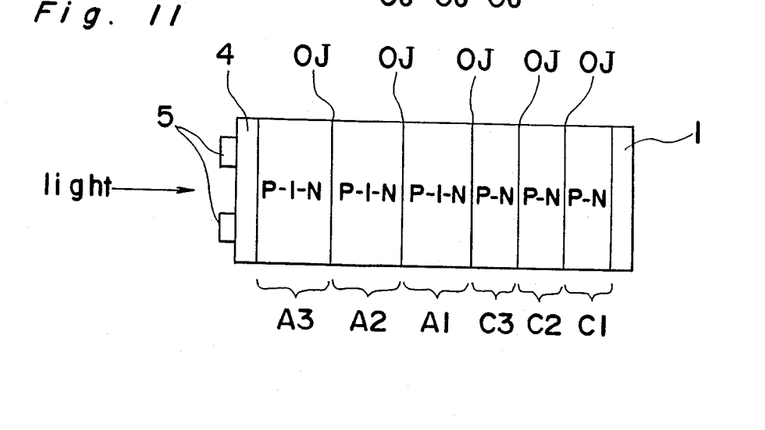
FIG. 11 is a schematic sectional view of a photovoltaic device according to a seventh embodiment of the present invention.

FIG. 11 shows schematically a photovoltaic device according to a seventh embodiment of the present invention. It comprises six cells connected in series. Three of them are HJ solar cells C1 to C3, and the others are amorphous cells A1 to A3. These cells are connected in series and are applied on a stainless steel substrate 1 with the heterojunction formed at the interface between cells C3 and A1. The stainless steel substrate 1 also serves as an electrode. The transparent conductive layer 4 and the comb-like electrode 5 are applied in succession on the cell A3. The crystalline semiconductor regions in the three HJ cells C1, C2, and C3 are made from germanium, silicon, and GaAs, respectively, and the energy gaps $E_{gc1}$, $E_{gc2}$, and $E_{gc3}$ in the crystalline regions are 0.7, 1.1, and 1.4 eV, respectively. On the other hand, the three amorphous cells A1, A2, and A3 are made from amorphous silicon germanide, amorphous silicon, and amorphous silicon carbide, respectively, and the energy gaps $E_{ga1}$, $E_{ga2}$, and $E_{ga3}$ are 1.6, 1.8, and 2.0 eV, respectively. Ohmic contacts are provided at the interfaces between the cells. Light of shorter wavelengths is absorbed in the third amorphous cell A3 with the largest energy gap $E_{ga3}$ situated adjoining the light-receiving surface 4 through which the light enters. As the light transmits through the cells one after another in series in the order of the energy gap, the light is absorbed successively from shorter wavelengths to longer wavelengths. Thus, light in a wide range may be utilized in a single device.

Figure 12:
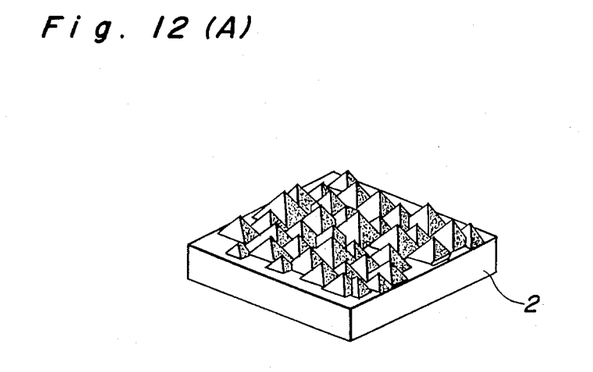
FIG. 12(A) is a perspective view, on an enlarged scale, of a substrate having an irregular surface.
FIG. 12(B) is a schematic sectional view of a solar cell manufactured by the use of the substrate shown in FIG. 12(A).

FIG. 12(A) shows a schematic model of a crystalline wafer 2 having an irregular surface designed so as to increase the absorption of the incident light. A number of small pyramid-shaped protrusions are formed on the surface of a crystalline semiconductor wafer 2 or thin plate made of an inorganic or organic solid. A photovoltaic cell according to all the embodiments of the present invention may be manufactured by depositing materials on a substrate of this type. A part of the photovoltaic device in the third embodiment manufactured by successive deposition on the substrate shown in FIG. 12(A) is shown in sectional representation in FIG. 12(B) wherein 4 designates a transparent conductive film, A an amorphous solar cell and C an H-J solar cell. Incident light transmitted through the conductive layer 4 is partially reflected at the interface between the transparent conductive layer 4 and the amorphous region 21, and between the semiconductors 2 and 3. For example, the solid line in FIG. 12(B) indicates the confinement of light in the semiconductor layer 2. The confinement effect caused by the multiple reflection may increase the conversion efficiency by enhancing the absorption of the incident light.

It should be noted that a photovoltaic device having tandem junction structures disclosed in the third to seventh embodiments can be used not only as a solar cell but also as a photodetector by using the different photosensitivities of unit cells composing the photovoltaic device.

While the embodiments of the present invention, as herein disclosed, constitute preferred forms, it is to be understood that other forms might be possible.

What is claimed as new is:

1. A photovoltaic device which converts solar energy to electric energy, comprising, in combination:
   a heterojunction solar cell comprising a crystalline semiconductor region and an amorphous or microcrystalline semiconductor region applied on said crystalline region with a p-n junction formed between said regions;

an amorphous solar cell tandemly applied on said heterojunction solar cell in optical and electrical series therewith, and comprising a p-type region, an i-type region and an n-type region of amorphous or microcrystalline semiconductor material applied in seriatim layers with a p-i-n junction formed between said regions, and a p-n junction formed at the interface between said heterojunction solar cell and said amorphous solar cell.

2. The device according to claim 1, wherein said solar cells are placed from the light-receiving side in the order of decreasing width of the energy gap of said i-type region in said amorphous solar cell and said crystalline region in said heterojunction solar cell.

3. The device according to claim 1, wherein at least one of said amorphous or microcrystalline regions is deposited by the use of a low temperature process.

4. The device according to claim 1, wherein said crystalline semiconductor region in said heterojunction solar cell comprises a wafer.

5. The device according to claim 4, wherein said crystalline region has an irregular surface.

6. The device according to claim 1, wherein said crystalline semiconductor region in said heterojunction solar cell comprises a thin film deposited on a substrate of inorganic material or organic material.

7. The device according to claim 6, wherein said substrate has an irregular surface.

8. A photovoltaic device which converts solar energy to electric energy, comprising, in combination:
a heterojunction solar cell comprising a crystalline semiconductor region and an amorphous or microcrystalline semiconductor region applied on said crystalline region with a p-n junction formed between said regions;
a plurality of tandemly arranged amorphous solar cells applied on said heterojunction solar cell in optical and electrical series therewith, and each comprising a p-type region, an i-type region and an n-type region of amorphous or microcrystalline semiconductor material applied in seriatim layers with a p-i-n junction formed between associated p-, i-, and n-type regions and forming a p-n junction between each adjacent pair of amorphous solar cells, and
a p-n junction formed at the interface between said heterojunction solar cell and the amorphous solar cell applied thereon.

9. The device according to claim 8, wherein said solar cells are placed from the light-receiving side in the order of increasing width of the energy gap of said i-type regions in said amorphous solar cells and said crystalline region in said heterojunction solar cell.

10. The device according to claim 8, wherein at least one of said amorphous or microcrystalline semiconductor regions is formed by the use of a low temperature process.

11. The device according to claim 8, wherein said crystalline semiconductor region comprises a wafer.

12. The device according to claim 11, wherein said crystalline region has an irregular surface.

13. The device according to claim 8, wherein said crystalline semiconductor region comprises a thin film deposited on a substrate of inorganic material or organic material.

14. The device according to claim 13, wherein said substrate has an irregular surface.

15. A photovoltaic device which converts solar energy to electric energy, comprising, in combination:
two tandemly arranged heterojunction solar cells in optical and electrical series each comprising a crystalline semiconductor region and an amorphous or microcrystalline semiconductor region applied on said crystalline region with a p-n junction formed between said regions,
an intervening amorphous or microcrystalline semiconductor region applied between an amorphous or microcrystalline region in one of said solar cells and a crystalline region in the other cell, the conductivity type of said intervening region being controlled to be of opposite type to that of said amorphous or microcrystalline semiconductor region in one of said solar cells but of the same type as that of the crystalline region in the other cell, and
a p-n junction formed at the interface between said intervening region and said amorphous or microcrystalline region in one of said solar cells.

16. The device according to claim 15, wherein said solar cells are placed in order of decreasing width of the energy gap of said crystalline regions in said heterojunction solar cells from the light-receiving side.

17. The device according to claim 15, wherein at least one of said amorphous or microcrystalline regions is deposited by using a low temperature process.

18. The device according to claim 15, wherein the crystalline semiconductor region situated at the farthest side from the light-receiving surface among the semiconductor regions of said device comprises a wafer.

19. The device according to claim 18, wherein said last mentioned crystalline region has an irregular surface.

20. The device according to claim 18, wherein said crystalline semiconductor region situated at the farthest side from the light-receiving surface among the semiconductor regions of said device comprises a thin film deposited on a substrate of inorganic material or organic material.

21. The device according to claim 20, wherein said substrate has an irregular surface.

22. A photovoltaic device which converts solar energy to electric energy, comprising, in combination:
a plurality of tandemly arranged heterojunction solar cells in optical and electrical series, each comprising a crystalline semiconductor region and an amorphous or microcrystalline semiconductor region applied on said crystalline region with a p-n junction formed between said regions;
an intervening amorphous or microcrystalline semiconductor region applied between an amorphous or microcrystalline semiconductor region in one of said heterojunction solar cells and a crystalline region in the adjacent heterojunction solar cell, the conductivity type of said intervening region being controlled to be of the opposite type to that of said amorphous or microcrystalline semiconductor region in one of said heterojunction solar cells but of the same type as that of the crystalline semiconductor region in the adjacent cell;
at least one amorphous solar cell tandemly arranged on one of said plurality of heterojunction solar cells in optical and electrical series therewith, and each comprising a p-type region, an i-type region and an n-type region of amorphous or microcrystalline semiconductor material applied in seriatim layers with a p-i-n junction formed between associated regions, and a p-n junction formed at the interface between said heterojunction solar cell and the amorphous solar cell applied thereon.

23. The device according to claim 22, wherein said solar cells are placed from the light-receiving side in the order of decreasing width of the energy gap of said i-type regions in said amorphous solar cells and said crystalline regions in said heterojunction solar cells.

24. The device according to claim 22, wherein at least one of said amorphous or microcrystalline regions is deposited by the use of a low temperature process.

25. The device according to claim 22, wherein the crystalline semiconductor region in the heterojunction solar cell situated at the farthest side from the light-receiving side comprises a wafer.

26. The device according to claim 25, wherein said last mentioned crystalline region has an irregular surface.

27. The device according to claim 22, wherein said crystalline semiconductor region in the heterojunction solar cell situated at the farthest side from the lightreceiving side comprises a thin film deposited on a substrate of inorganic material or organic material.

28. The device according to claim 27, wherein said substrate has an irregular surface.

29. A photovoltaic device which converts solar energy to electric energy, comprising, in combination:

a plurality of tandemly arranged heterojunction solar cells in optical and electrical series, each comprising a crystalline semiconductor region and an amorphous or microcrystalline semiconductor region applied on said crystalline region with a p-n junction formed between said regions;

an intervening amorphous or microcrystalline semiconductor region applied between an amorphous or microcrystalline region in one of said heterojunction solar cells and a crystalline region in the adjacent heterojunction solar cell, the conductivity type of said intervening region being controlled to be of the opposite type to that of said amorphous or microcrystalline semiconductor region in one of said heterojunction solar cells but of the same type as that of the crystalline semiconductor region in the adjacent cell;

a plurality of amorphous solar cells tandemly arranged on said heterojunction solar cells in optical and electrical series therewith, and each comprising a p-type region, an i-type region and an n-type region of amorphous or microcrystalline semiconductor material applied in seriatim layers with a p-i-n junction formed between associated regions, and a p-n junction formed at the interface between one of said heterojunction solar cells and the amorphous solar cell applied thereon.

30. The device according to claim 29, wherein said solar cells are placed from the light-receiving side in the order of decreasing width of the energy gap of said i-type regions in said amorphous solar cells and said crystalline regions in said heterojunction solar cells.

31. The device according to claim 29, wherein at least one of said amorphous or microcrystalline regions is deposited by the use of a low temperature process.

32. The device according to claim 29, wherein said crystalline semiconductor region in the heterojunction solar cell situated at the farthest side from the light-receiving side comprises a wafer.

33. The device according to claim 32, wherein said last mentioned crystalline region has an irregular surface.

34. The device according to claim 29, wherein the crystalline semiconductor region in the heterojunction solar cell situated at the farthest side from the ligh­treceiving side comprises a thin film deposited on a substrate of inorganic material or organic material.

35. The device according to claim 34, wherein said substrate has an irregular surface.

* * * * *